(12) United States Patent
Ghosh et al.

(10) Patent No.: US 9,905,315 B1
(45) Date of Patent: Feb. 27, 2018

(54) ERROR-RESILIENT MEMORY DEVICE WITH ROW AND/OR COLUMN FOLDING WITH REDUNDANT RESOURCES AND REPAIR METHOD THEREOF

(71) Applicant: NXP USA, INC., Austin, TX (US)

(72) Inventors: Prokash Ghosh, Mogra (IN); Sourav Roy, Kolkata (IN); Neha Raj, Ghaziabad (IN)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 15/413,429

(22) Filed: Jan. 24, 2017

(51) Int. Cl.
*G11C 29/00* (2006.01)
*G11C 5/06* (2006.01)

(52) U.S. Cl.
CPC .............. *G11C 29/70* (2013.01); *G11C 5/06* (2013.01)

(58) Field of Classification Search
CPC .................................................. G11C 29/70
See application file for complete search history.

(56) References Cited

U.S. PATENT DOCUMENTS

| | | | |
|---|---|---|---|
| 4,962,322 A | 10/1990 | Chapman | |
| 5,134,616 A * | 7/1992 | Barth, Jr. ............ | G06F 11/1008 714/710 |
| 5,394,369 A * | 2/1995 | Kagami ................. | G11C 29/70 365/200 |
| 5,396,124 A * | 3/1995 | Sawada ................. | G11C 29/80 326/13 |
| 5,546,336 A | 8/1996 | Pechanek et al. | |
| 5,617,364 A * | 4/1997 | Hatakeyama .......... | G11C 29/78 365/185.09 |
| 5,822,248 A * | 10/1998 | Satori .................... | G11C 16/28 365/185.11 |
| 5,841,783 A * | 11/1998 | Suzuki .................... | G11C 29/72 714/704 |
| 5,999,482 A * | 12/1999 | Kornachuk ............. | G11C 5/063 365/194 |
| 6,163,475 A * | 12/2000 | Proebsting ............. | G11C 7/065 257/E21.659 |
| 6,440,801 B1 | 8/2002 | Furukawa et al. | |
| 6,795,942 B1 | 9/2004 | Schwarz | |
| 7,733,697 B2 * | 6/2010 | Picca ...................... | G11C 29/82 365/185.09 |

(Continued)

OTHER PUBLICATIONS

LogicVision (MentorGraphics), "Memory repair primer", WhitePaper, Apr. 2007.

(Continued)

*Primary Examiner* — Anthan Tran
*Assistant Examiner* — Mushfique Siddique
(74) *Attorney, Agent, or Firm* — Charles E. Bergere

(57) ABSTRACT

An error-resilient memory device includes sets of memory blocks and redundant memory blocks for storing a set of data bits. A memory block includes a set of memory cells, each memory cell is adjacent to at least two other memory cells, and a memory block is formed by a matrix of the set of memory cells. In a row-folded implementation, a word line is connected to each memory cell, and a set of bit lines is connected to the corresponding set of memory cells. In a column-folded implementation, a bit line is connected to each memory cell, and a set of word lines is connected to the corresponding set of memory cells. A redundant memory block is used to store the set of data bits when the memory block includes a fault.

11 Claims, 6 Drawing Sheets

(56) References Cited

U.S. PATENT DOCUMENTS

| | | | | |
|---|---|---|---|---|
| 8,908,436 B2* | 12/2014 | Martinozzi | ............ | G11C 16/20 |
| | | | | 365/185.17 |
| 2002/0006062 A1* | 1/2002 | Otori | ...................... | G11C 5/025 |
| | | | | 365/189.07 |
| 2006/0098503 A1* | 5/2006 | Jeong | ................... | G11C 29/808 |
| | | | | 365/200 |
| 2008/0225613 A1* | 9/2008 | Afghahi | ............... | G11C 29/789 |
| | | | | 365/200 |
| 2009/0096478 A1* | 4/2009 | Keeth | ...................... | G11C 5/02 |
| | | | | 324/756.05 |
| 2009/0129145 A1* | 5/2009 | Slesazeck | ................ | G11C 8/14 |
| | | | | 365/174 |
| 2010/0271891 A1* | 10/2010 | Dell | ........................ | G11C 5/06 |
| | | | | 365/200 |
| 2012/0314520 A1* | 12/2012 | Vogelsang | ............... | G11C 8/14 |
| | | | | 365/200 |
| 2013/0094295 A1* | 4/2013 | Bartoli | ................. | G11C 29/789 |
| | | | | 365/185.05 |
| 2016/0139828 A1* | 5/2016 | Yan | ....................... | G06F 3/0616 |
| | | | | 711/103 |

OTHER PUBLICATIONS

Yervant Zorian, "Embedded Memory Test & Repair: Infrastructure IP for SOC Yield", International Test Conference, 2002.

J. Wang, "SRAM parametric failures analysis", DAC (Design Automation Conference), 2009.

J. Kim et, al., "Modeling SRAM Failure Rates to Enable Fast, Dense, Low-Power Caches", Proc. of SELSE (Silicon Errors in Logic—System Effects), Carnegie Mellon University, USA, 2009.

* cited by examiner

ERROR-RESILIENT MEMORY DEVICE WITH ROW AND/OR COLUMN FOLDING WITH REDUNDANT RESOURCES AND REPAIR METHOD THEREOF

BACKGROUND

The present invention relates generally to memory devices, and more particularly, to an error-resilient memory device having row and/or column folding.

A conventional memory device includes multiple memory cells arranged in sets of rows and columns. The sets of rows and columns form a matrix of memory cells. The memory device further includes sets of word lines and bit lines. Word lines are connected to corresponding rows of the set of rows, and bit lines are connected to corresponding columns of the set of columns. Thus, the memory cells are connected to the bit lines corresponding to the columns of the memory cells and to the word lines corresponding to the rows of the memory cells. The memory cells store corresponding data bits received via the bit lines when corresponding ones of the word lines are active.

During fabrication of the memory device, variations in the manufacturing process can cause faults that damage one or more of the memory cells, which can corrupt data stored in the damaged cells. During testing of the memory device (performed after fabrication), damaged memory cells are identified and the memory device is discarded, resulting in loss of time and a waste of resources.

A known technique to avoid discarding memory devices with damaged memory cells is to alter the design of the memory device such that it is error-resilient. An error-resilient memory device includes sets of rows and columns of redundant memory cells in addition to the matrix of memory cells. The error-resilient memory device further includes corresponding sets of redundant word lines and bit lines. Hereinafter, the set of rows of redundant memory cells is referred to as "redundant rows", and the set of columns of redundant memory cells is referred to as "redundant columns".

The error-resilient memory device also includes a control circuit. When one or more of the memory cells are damaged, the rows and columns of memory cells corresponding to the damaged memory cells are referred to as damaged rows and damaged columns, respectively. During testing, the control circuit identifies the damaged memory cells and determines the number of redundant rows or redundant columns so that data is not stored in damaged cells. The control circuit also identifies at least one of the redundant rows and redundant columns based on the number of the redundant rows and redundant columns, and activates the corresponding redundant word lines and the redundant bit lines so that data will be stored in the redundant cells instead of the damaged cells. Thus, an error-resilient memory device with damaged cells does not necessarily need to be discarded after testing. However, the number of redundant memory cells is fixed and finite. Hence, if too many cells are damaged (when the number of faults in the error-resilient memory device is greater than a threshold number of faults), then the memory device must be discarded.

Often the variations in the manufacturing process generate a set of faults within a finite region of the memory device. Such faults are referred to as "concentrated faults". Each damaged row and each damaged column include sets of damaged and undamaged memory cells. Although the undamaged memory cells within the finite region could store data, they are not used because they are not readily addressable and so the data is stored in the redundant rows/columns. This results in a waste of the undamaged cells. Thus, the memory repair efficiency of the error-resilient memory device is low.

It is known that the determination of the redundant rows and redundant columns is a non-deterministic polynomial time (NP) complete problem and hence, requires a complex control circuit. Such complex control circuitry increases the power consumption. Further, determination of the redundant rows and redundant columns is a time-consuming process. Thus, it would be advantageous to have a low power error-resilient memory device that makes efficient use of the memory cells and does not require complex control circuitry.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
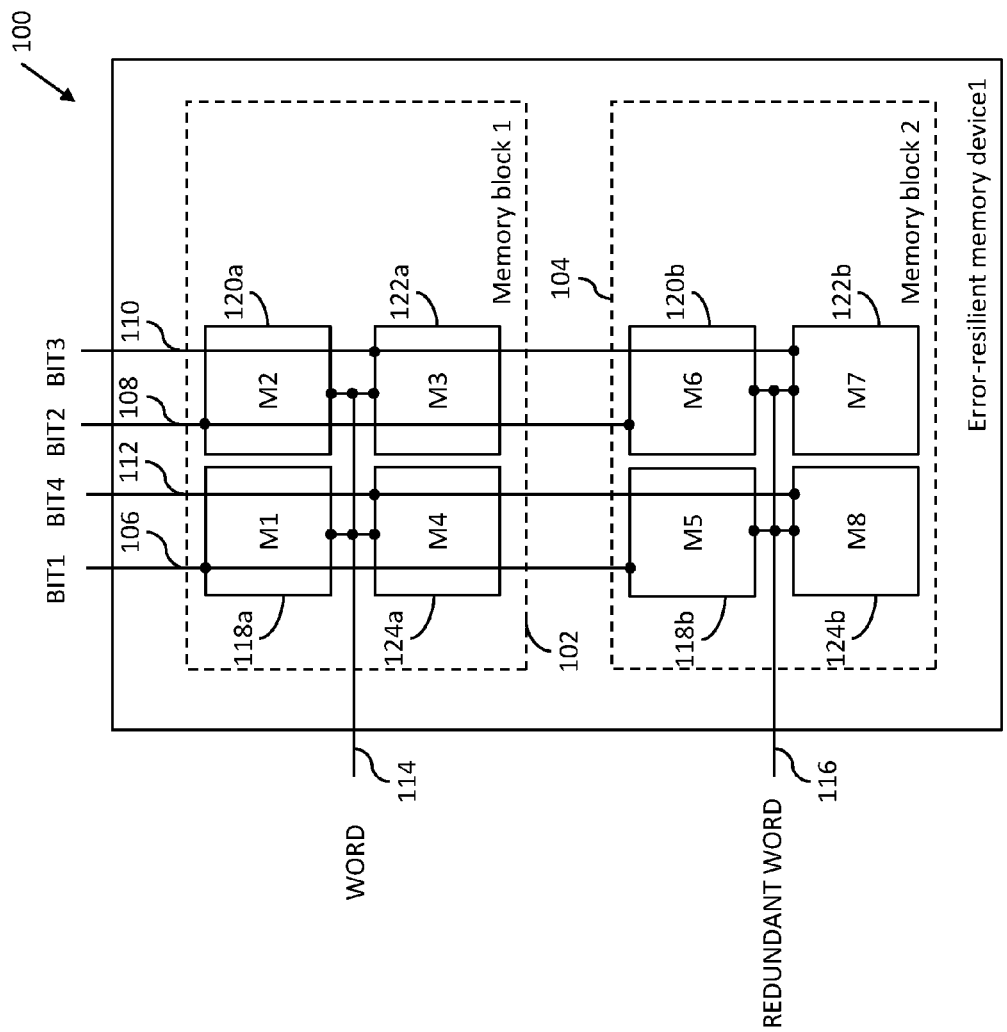
FIG. 1 is a schematic block diagram of an error-resilient memory device including first and second memory blocks in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment of the present invention, an error-resilient memory device is shown. The error-resilient memory device includes a first memory block that includes a first set of memory cells. The first memory block is connected to a first word line and a set of bit lines. The first memory block receives a set of data bits by way of the corresponding set of bit lines and stores the set of data bits when the first word line is active. Each memory cell of the first set of memory cells is adjacent to at least two other memory cells of the first memory block. Thus, a row of the first set of memory cells is folded. Further, the first word line is connected to each memory cell of the first set of memory cells. Further, the set of bit lines is connected to the corresponding first set of memory cells.

In another embodiment of the present invention, an error-resilient memory device is shown. The error-resilient memory device includes a first memory block that includes a first set of memory cells. The first memory block is connected to a first bit line and a set of word lines. The first memory block receives a first data bit by way of the first bit line and stores the first data bit when at least one word line of the set of word lines is active. Each memory cell of the first set of memory cells is adjacent to at least two other memory cells of the first memory block. Thus, a column of the first set of memory cells is folded. Further, the first bit line is connected to each memory cell of the first set of memory cells. Further, the set of word lines is connected to the corresponding first set of memory cells.

In yet another embodiment of the present invention, an error-resilient memory device is shown. The error-resilient memory device includes first and second memory blocks. The first memory block includes a first set of memory cells. The first memory block is connected to a first bit line and a set of word lines, receives a first data bit by way of the first bit line, and stores the first data bit when at least one word line of the set of word lines is active. Each memory cell of the first set of memory cells is adjacent to at least two other memory cells of the first memory block. Thus, a column of the first set of memory cells is folded. Further, the first bit line is connected to each memory cell of the first set of memory cells. Further, the set of word lines is connected to the corresponding first set of memory cells. The second memory block that includes a second set of memory cells. The second memory block is connected to a redundant bit line and the set of word lines, receives a redundant data bit by way of the redundant bit line, and stores the redundant data bit when at least one word line of the set of word lines is active. Each memory cell of the second set of memory cells is adjacent to at least two other memory cells of the second set of memory cells. Thus, a column of the second set of memory cells is folded. Further, the redundant bit line is connected to each memory cell of the second set of memory cells. Further, the set of word lines is connected to the corresponding second set of memory cells.

Various embodiments of the present invention provide an error-resilient memory device that includes first and second memory blocks for storing a set of data bits. The first and second memory blocks include first and second set of memory cells. The second memory block stores the set of data bits when at least one memory cell of the first memory block includes a fault. Each of the first and second sets of memory cells forms a matrix. Each memory cell of the first and second sets of memory cells is adjacent to at least two other memory cells of the first and second sets of memory cells. The first memory block is connected to at least one word line of a set of word lines and at least one bit line of a set of bit lines. The first memory block receives at least one data bit of a set of data bits by way of a corresponding bit line of the set of bit lines. In a row-folding implementation of the error-resilient memory device, a row of each of the first and second sets of memory cells is folded to form a corresponding matrix. Hence, a first word line of the set of word lines is connected to each memory cell of the first set of memory cells. Further, a redundant word line is connected to each memory cell of the second set of memory cells. Further, the set of bit lines is connected to the corresponding memory cells of each of the first and second sets of memory cells. In a column-folding implementation of the error-resilient memory device, a column of each of the first and second sets of memory cells is folded to form a corresponding matrix. Hence, a first bit line of the set of bit lines is connected to each memory cell of the first set of memory cells. Further, a redundant bit line is connected to each memory cell of the second set of memory cells. The set of word lines is connected to the corresponding memory cells of each of the first and second sets of memory cells.

Thus, the error-resilient memory device stores the set of data bits in the second memory block when the first memory block includes a fault without consuming time for determining the redundant rows and redundant columns. Further, when multiple faults occur in adjacent memory cells of the first memory block, only one memory block (i.e., the second memory block) is required to store the corresponding set of data bits instead of utilizing an entire row or column of memory cells as is done in the conventional memory device. Thus, the first set of memory cells is efficiently utilized.

Referring now to FIG. 1, a schematic block diagram of an error-resilient memory device 100 including first and second memory blocks 102 and 104 in accordance with an embodiment of the present invention is shown. The error-resilient memory device 100 is accessed for storing and reading a set of data bits using an input memory address. Undesirable process variations in the manufacturing process of the error-resilient memory device 100 may generate faults in the error-resilient memory device 100. When the faults occur within a finite region of the error-resilient memory device 100, the faults are referred to as 'a set of concentrated faults'. When the faults occur in a scattered manner across the area of the error-resilient memory device 100, each of the faults is referred to as 'a random fault'. The faults are detected during the testing process of the error-resilient memory device 100. However, the error-resilient memory device 100 is usable despite the detection of at least one of a concentrated fault and a random fault, i.e., it is resilient to errors occurring due to both the concentrated and random faults.

The error-resilient memory device 100 further includes first through fourth bit lines 106-112, a word line 114, and a redundant word line 116. The first memory block 102 is accessed using a memory address. In the presently preferred embodiment, the first through fourth bit lines 106-112, the word line 114, and the redundant word line 116 are metallic inter-connections. The error-resilient memory device 100 further includes a control logic (not shown).

The first memory block 102 includes first through fourth memory cells 118a-124a, which are shown as M1-M4 in the FIG. 1, respectively. The second memory block 104 includes fifth through eighth memory cells 118b-124b, which are shown as M5-M8 in the FIG. 1, respectively. It will be understood by a person skilled in the art that the number of memory cells in each of the first and second memory blocks 102 and 104 is an exponent of two and is not limited to a second exponent of two, i.e., four.

In the presently preferred embodiment, the first memory block 102 is used for storing the set of data bits (BIT1-BIT4) and is referred to as 'a functional memory block'. Each of the first through fourth memory cells 118a-124a is referred to as 'a functional memory cell'. Further, the second memory block 104 is referred to as 'a redundant memory block' and is used for storing at least one data bit of the set of data bits when the first memory block 102 includes a fault. Each of the fifth through eighth memory cells 118b-124b is referred to as 'a redundant memory cell'. Further, a set of strap cells (not shown) and a set of isolation cells (not shown) are used in the error-resilient memory device 100 for providing power to the first and second memory blocks 102 and 104 and also for providing isolation between the first and second memory blocks 102 and 104.

The control logic determines a state (active or inactive) of the redundant word line 116. In one embodiment, the control logic is implemented using a control logic software (not shown) run by a processor (not shown). In another embodiment, the control logic is implemented using a control circuit (not shown). For example, the control circuit is an address decoder (not shown) that compares an input memory address with the memory address. The address decoder generates a word signal WORD when the input memory address matches the memory address. The word line 114 is active or inactive based on the word signal WORD.

The first memory cell 118a is connected to the word line 114 and the first bit line 106 and receives a first data bit (BIT1) of the set of data bits by way of the first bit line 106. The second memory cell 120a is connected to the word line 114 and the second bit line 108 and receives a second data bit (BIT2) of the set of data bits by way of the second bit line 108. The third memory cell 122a is connected to the word line 114 and the third bit line 110 and receives a third data bit (BIT3) of the set of data bits by way of the third bit line 110. The fourth memory cell 124a is connected to the word line 114 and the fourth bit line 112 and receives a fourth data bit (BIT4) of the set of data bits by way of the fourth bit line 112. The first through fourth memory cells 118a-124a store the first through fourth data bits (BIT1-BIT4) when the word line 114 is active. The first through fourth memory cells 118a-124a do not store the first through fourth data bits (BIT1-BIT4) when word line 114 is inactive.

The first through fourth memory cells 118a-124a of the first memory block 102 form a matrix of memory cells. The first memory cell 118a is adjacent to the second and fourth memory cells 120a and 124a. The second memory cell 120a is adjacent to the first and third memory cells 118a and 122a. The third memory cell 122a is adjacent to the second and fourth memory cells 120a and 124a. The fourth memory cell 124a is adjacent to the first and third memory cells 118a and 122a. This arrangement is different from that in a conventional memory device in which the first through fourth memory cells 118a-124a are linearly arranged in a row. Thus, a row (i.e., all the memory cells of the row including the first through fourth memory cells 118a-124a) of the conventional memory device is folded to form the matrix in the error-resilient memory device 100 of the present invention. This matrix is referred to as the first memory block 102. Hence, this implementation of the error-resilient memory device 100 is referred to as a 'row-folding implementation'. Further, since the word line 114 that was connected to each memory cell placed in a linear arrangement in the conventional memory device now appears to have been folded to connect to each memory cell in the first memory block 102. Thus, the 'row-folding implementation' is also referred to as 'word line-folding implementation'. In one embodiment, the first through fourth memory cells 118a-124a form a square matrix. In another embodiment, the first through fourth memory cells 118a-124a form a rectangular matrix (not shown).

Figure 2A:
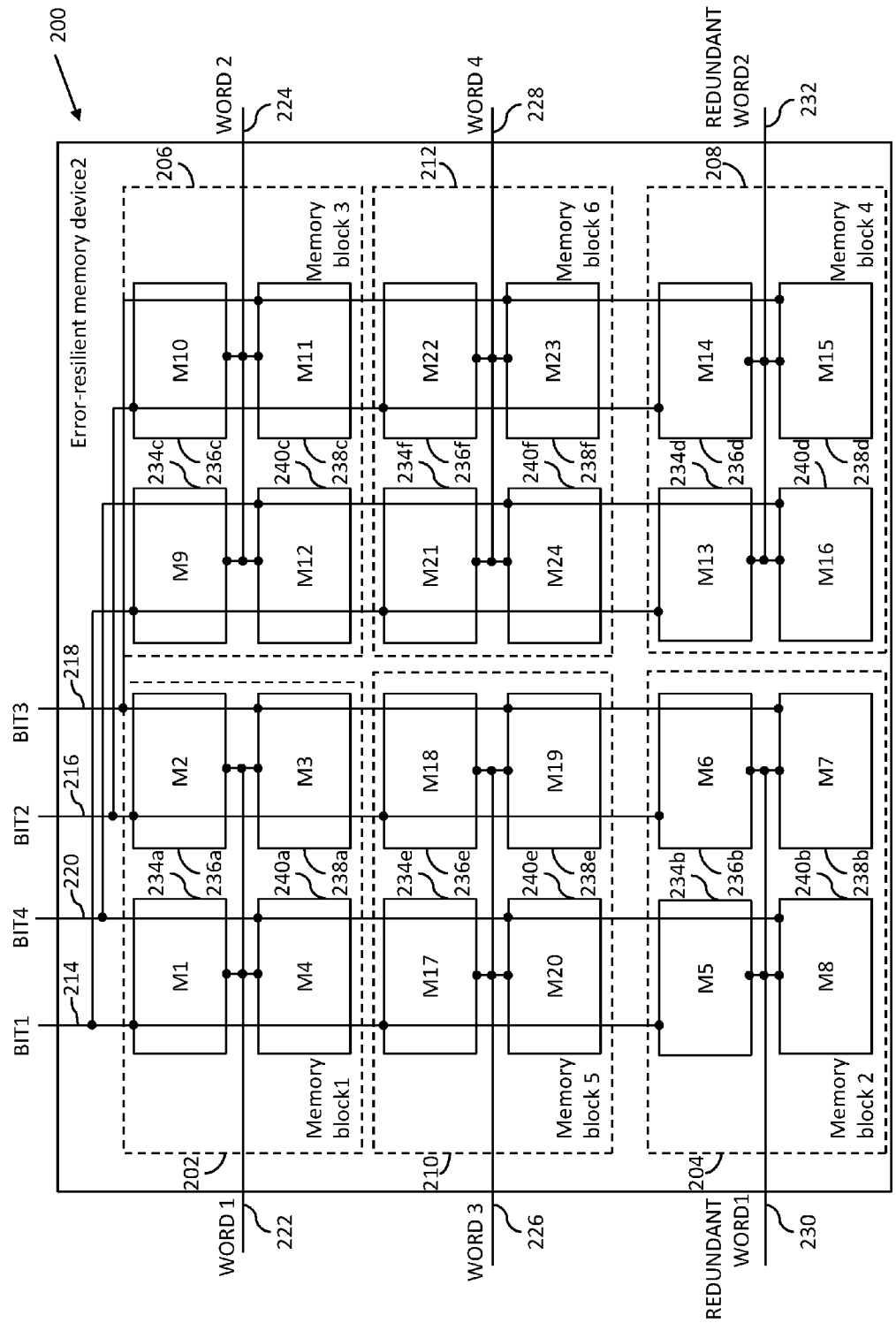
FIG. 2A is a schematic block diagram of an error-resilient memory device including first through sixth memory blocks in accordance with an embodiment of the present invention.

Referring now to FIG. 2A, a schematic block diagram of an error-resilient memory device 200 including first through sixth memory blocks 202-212 in accordance with an embodiment of the present invention is shown. The first, third, fifth, and sixth memory blocks 202, 206, 210, and 212 are accessed using first through fourth memory addresses, respectively. Further, the error-resilient memory device 200 includes first through fourth bit lines 214-220, first through fourth word lines 222-228, and first and second redundant word lines 230 and 232. In the presently preferred embodiment, the first through fourth bit lines 214-220, the first through fourth word lines 222-228, and the first and second redundant word lines 230 and 232 are metallic inter-connections. The error-resilient memory device 200 further includes a control logic (not shown). In one embodiment, the error-resilient memory device 200 includes a clock source (not shown) that provides a clock signal (not shown). In another embodiment, the error-resilient memory device 200 is connected to an external clock source that provides the clock signal.

The first memory block 202 includes first through fourth memory cells 234a-240a, which are shown as M1-M4 in FIG. 2A, respectively. The second memory block 204 includes fifth through eighth memory cells 234b-240b, which are shown as M5-M8 in FIG. 2A, respectively. The third memory block 206 includes ninth through twelfth memory cells 234c-240c, which are shown as M9-M12 in FIG. 2A, respectively. The fourth memory block 208 includes thirteenth through sixteenth memory cells 234d-240d, which are shown as M13-M16 in FIG. 2A, respectively. The fifth memory block 210 includes seventeenth through twentieth memory cells 234e-240e, which are shown as M17-M20 in FIG. 2A, respectively. The sixth memory block 212 includes twenty-first through twenty-fourth memory cells 234f-240f, which are shown as M21-M24 in FIG. 2A, respectively.

In the presently preferred embodiment, each of the first, third, fifth, and sixth memory blocks 202, 206, 210, 212 is 'a functional memory block'. Each of the first, third, fifth, and sixth memory blocks 202, 206, 210, and 212 is structurally and functionally similar to the first memory block 102 of the error-resilient memory device 100. Each of the first through fourth memory cells 234a-240a, ninth through twelfth memory cells 234c-240c, and seventeenth through twenty-fourth memory cells 234e-240e and 234f-240f is 'a functional memory cell'. Further, each of the second and fourth memory blocks 204 and 208 is 'a redundant memory block' and is used for storing at least one data bit of the set of data bits when at least one of the first, third, fifth, and sixth memory blocks 202, 206, 210, and 212 includes a fault. Each of the fifth through eighth and thirteenth through sixteenth memory cells 234b-240b and 234d-240d is 'a redundant memory cell'. Each of the second and fourth memory blocks 204 and 208 is structurally and functionally similar to the second memory block 104 of the error-resilient memory device 100. Further, a set of strap cells (not shown) and a set of isolation cells (not shown) are used in the error-resilient memory device 200 for providing power to the first through sixth memory blocks 202-212 and also for providing isolation among the first through sixth memory blocks 202-212.

The control logic of the error-resilient memory device 200 is structurally and functionally similar to the control logic of the error-resilient memory device 100. In one embodiment, the control logic of the error-resilient memory device 200 is implemented using a control circuit. The control circuit receives the input memory address and determines whether it is equal to one of the first through fourth memory addresses. When the input memory address matches one of the first through fourth memory addresses, the control circuit generates corresponding one of first through fourth word signals (WORD1-WORD4) and activates corresponding one of the first through fourth word lines 222-228. Further, the control circuit determines an active or inactive state of the first and second redundant word lines 230 and 232 based on the faults detected in at least one of the first, third, fifth, and sixth memory blocks 202, 206, 210, and 212 and a state (active or inactive) of at least one of the first through fourth word lines 222-228. When a fault occurs in one or more memory cells of the first, third, fifth and sixth memory blocks 202, 206, 210, and 212, at least one of the first and second redundant word lines 230 and 232 is active. When the first, third, fifth and sixth memory blocks 202, 206, 210, and 212 do not include a fault, each of the first and second redundant word lines 230 and 232 is inactive.

Each of the first through sixth memory blocks 202-212 is connected to the first through fourth bit lines 214-220 for receiving the first through fourth data bits (BIT1-BIT4) of the set of data bits, respectively. The first, third, fifth, and sixth memory blocks 202, 206, 210, and 212 are connected to the first through fourth word lines 222-228, respectively. Thus, the first, third, fifth, and sixth memory blocks 202, 206, 210, and 212 are addressable using the first through fourth word lines 222-228, respectively. The second and fourth memory blocks 204 and 208 are connected to the first and second redundant word lines 230 and 232, respectively. The first memory block 202 is adjacent to the third and fifth memory blocks 206 and 210. The third memory block 206 is adjacent to the first and sixth blocks 202 and 212. The fifth memory block 210 is adjacent to the first and sixth blocks 202 and 212. The sixth memory block 212 is adjacent to the third and fifth blocks 206 and 210. The second and fourth memory blocks 204 and 208 are adjacent with each other.

In operation, the first through fourth memory cells 234a-240a receive the first through fourth data bits (BIT1-BIT4) by way of the first through fourth bit lines 214-220, respectively, the first word line 222 is active, and the first memory block 202 does not include a fault. Hence, the first through fourth memory cells 234a-240a store the first through fourth data bits (BIT1-BIT4).

Figure 2B:
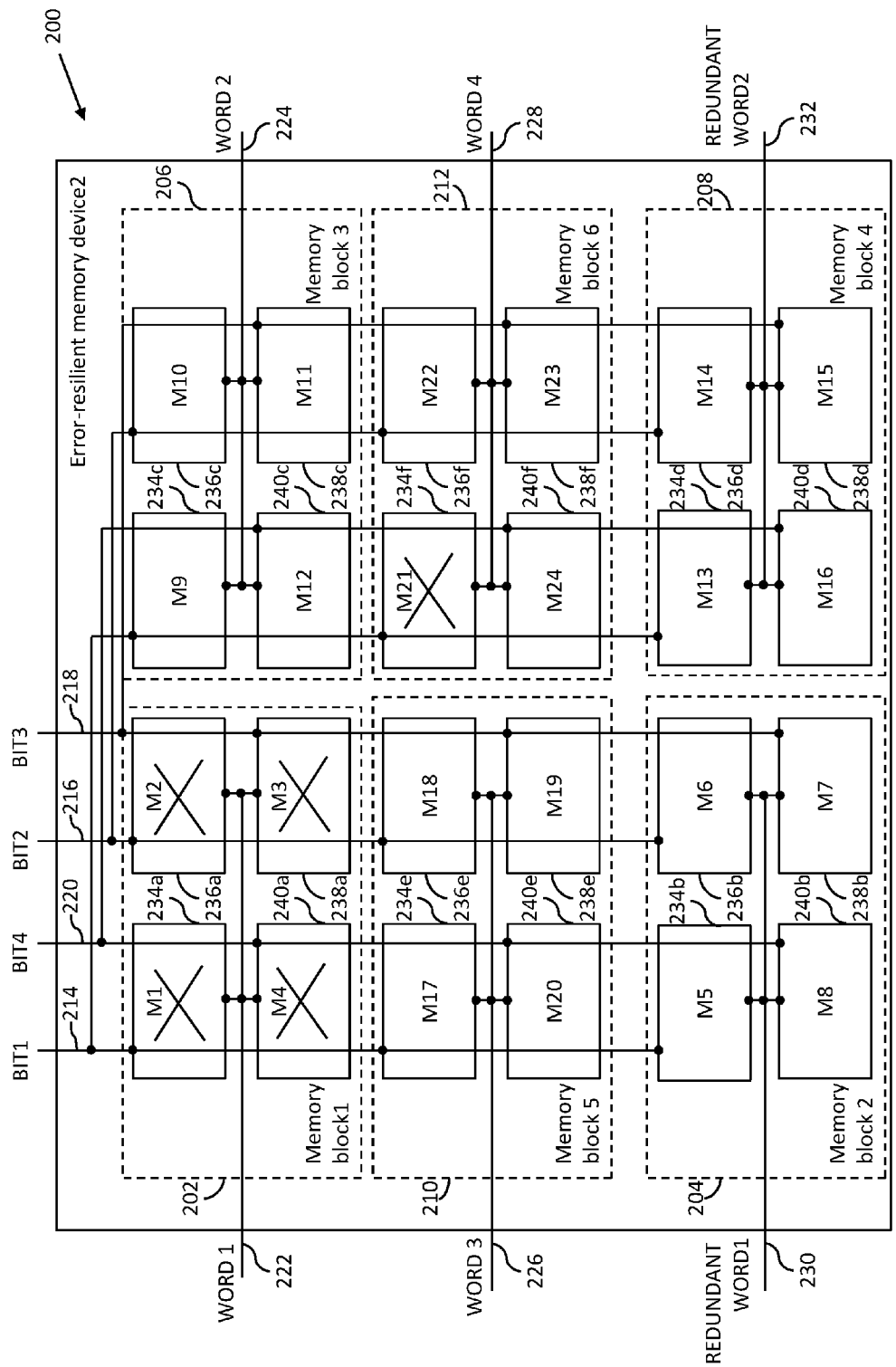
FIG. 2B is a schematic block diagram of the error-resilient memory device of FIG. 2A that illustrates a set of faults.

Referring now to FIG. 2B, a schematic block diagram of the error-resilient memory device 200 that has a set of faults in accordance with an embodiment of the present invention is shown. The set of faults includes a set of concentrated faults and a random fault. A memory cell that includes a fault is marked using a cross sign (X) in FIG. 2B. During testing, the set of concentrated faults is detected in the first through fourth memory cells 234a-240a, which are referred to as a set of damaged memory cells. Further, a random fault is detected in the twenty-first memory cell 234f, which is referred to as a damaged memory cell. Thus, the first through fourth memory cells 234a-240a and the twenty-first memory cell 234f are damaged.

In operation, during a first clock cycle of the clock signal, the first through fourth memory cells 234a-240a receive the first through fourth data bits (BIT1-BIT4) by way of the first through fourth bit lines 214-220, respectively, and the first word line 222 is active. Further, during a second clock cycle of the clock signal, the twenty-first through twenty-fourth memory cells 234f-240f receive first through fourth data bits (BIT1-BIT4) by way of the first through fourth bit lines 214-220, respectively, and the fourth word line 228 is active. It will be understood by a person skilled in the art that the first and second clock cycles are not consecutive to each other.

The first through fourth memory cells 234a-240a are addressable using the first word line 222. Due to the detection of the set of concentrated faults in the first memory block 202, the control circuit activates only one redundant word line, i.e., the corresponding first redundant word line 230 for storing the first through fourth data bits (BIT1-BIT4) to overcome the inaccuracy in storage of the first through fourth data bits (BIT1-BIT4). When the first redundant word line 230 is active, the fifth through eighth memory cells 234b-240b receive and store the first through fourth data bits (BIT1-BIT4), respectively, instead of the first through fourth memory cells 234a-240a.

Due to the detection of a random fault in the sixth memory block 212, the control circuit activates the corresponding second redundant word line 232 during the second clock cycle. When the second redundant word line 232 is active, the thirteenth through sixteenth memory cells 234d-240d receive and store the first through fourth data bits (BIT1-BIT4), respectively, instead of the twenty-first through twenty-fourth memory cells 234f-240f.

For the aforementioned embodiment with the set of concentrated faults and a random fault, it is known to a person skilled in the art that a conventional error-resilient memory device requires at least three redundant rows for storage of data bits of the damaged memory cells. Further, the conventional error-resilient memory device stores data bits corresponding to the first through fourth, ninth through twelfth, and seventeenth, eighteenth, twenty-first, and twenty-second memory cells 234a-240a, 234c-240c, 234e, 236e, 234f, and 236f, respectively, in three redundant rows. Although the ninth through twelfth, seventeenth, and eighteenth memory cells 234c-240c, 234e, and 236e, respectively, are undamaged, they are not utilized in the conventional error-resilient memory device, thereby decreasing the efficiency thereof. The error-resilient memory device 200 is efficient and requires only two redundant memory blocks instead of three redundant rows of the conventional error-resilient memory device for accurately storing the first through fourth data bits (BIT1-BIT4) despite damage to the first through fourth memory cells 234a-240a and the twenty-first memory cell 234f.

Figure 3:
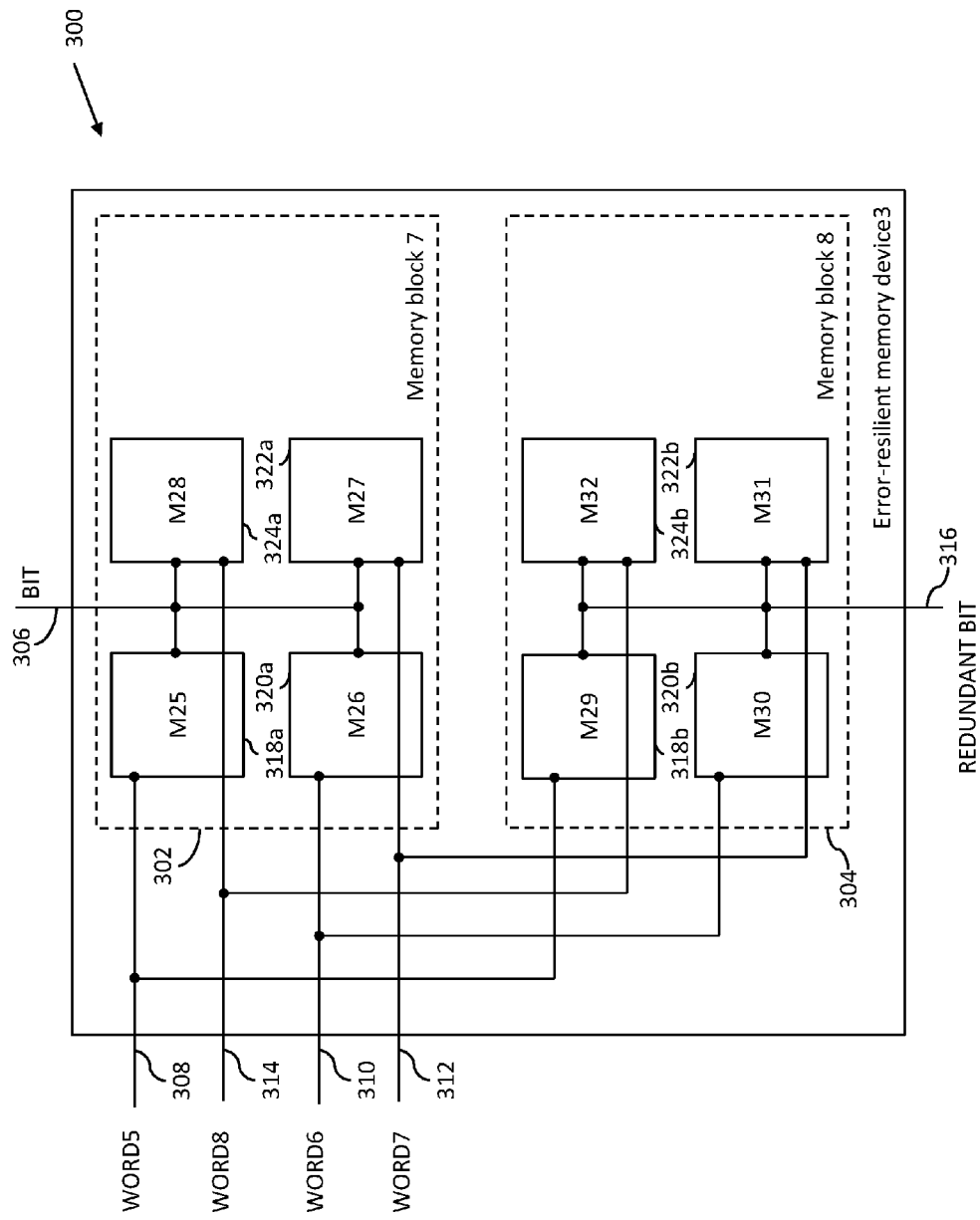
FIG. 3 is a schematic block diagram of an error-resilient memory device including seventh and eighth memory blocks in accordance with another embodiment of the present invention.

Referring now to FIG. 3, a schematic block diagram of an error-resilient memory device 300 including seventh and eighth memory blocks 302 and 304 in accordance with another embodiment of the present invention is shown. The error-resilient memory device 300 is accessed for storing a set of data bits and reading the set of data bits using an input memory address. The error-resilient memory device 300 may include at least one of a concentrated fault and a random fault similar to the error resilient memory devices 100 and 200 of FIGS. 1, 2A, and 2B. The faults are detected during the testing process of the error-resilient memory device 300. The error-resilient memory device 300 is usable despite the detection of the at least one of the concentrated fault and the random fault.

The error-resilient memory device 300 further includes a bit line 306, fifth through eighth word lines 308-314, and a redundant bit line 316. In the presently preferred embodiment, the fifth through eighth word lines 308-314, the bit line 306, and the redundant bit line 316 are metallic interconnections. The error-resilient memory device 300 further includes a control logic (not shown).

The seventh memory block 302 includes twenty-fifth through twenty-eighth memory cells 318a-324a, which are shown as M25-M28 in the FIG. 3, respectively. The twenty-fifth through twenty-eighth memory cells 318a-324a are addressed using fifth through eighth memory addresses, respectively. The eighth memory block 304 includes twenty-ninth through thirty-second memory cells 318b-324b, which are shown as M29-M32 in the FIG. 3, respectively. It will be understood by a person skilled in the art that the number of memory cells in each of the seventh and eighth memory blocks 302 and 304 is equal to an exponent of two and is not limited to a second exponent of two, i.e., four.

In the presently preferred embodiment, the seventh memory block 302 is used for storing a set of data bits and is referred to as 'a functional memory block'. Each of the twenty-fifth through twenty-eighth memory cells 318a-324a is referred to as 'a functional memory cell'. Further, the eighth memory block 304 is referred to as 'a redundant memory block' and is used for storing at least one data bit of the set of data bits when the seventh memory block 302 includes a fault. Each of the twenty-ninth through thirty-second memory cells 318b-324b is referred to as 'a redundant memory cell'. Further, a set of strap cells and a set of isolation cells are used in the error-resilient memory device 300 for providing power to the seventh and eighth memory blocks 302 and 304 and for providing isolation between the seventh and eighth memory blocks 302 and 304.

The control logic determines a value provided to the redundant bit line 316. In one embodiment, the control logic is implemented using a control logic software (not shown) run by a processor (not shown). In another embodiment, the control logic is implemented using a control circuit (not shown). For example, the control circuit is an address decoder (not shown). The control circuit receives the input memory address and determines whether it is equal to one of the fifth through eighth memory addresses. When the input memory address matches one of the fifth through eighth memory addresses, the control circuit generates a corresponding word signal of fifth through eighth word signals (WORD5-WORD8) and activates a corresponding word line of the fifth through eighth word lines 308-314. Further, the control circuit provides a value of the fifth data bit (BIT5) to the redundant bit line 316 based on one or more faults detected in the seventh memory block 302 and a state of at least one of the fifth through eighth word lines 308-314.

The twenty-fifth memory cell 318a is connected to the bit line 306 and the fifth word line 308 and receives the fifth data bit (BIT5) of the set of data bits by way of the bit line 306. The twenty-sixth memory cell 320a is connected to the bit line 306 and the sixth word line 310 and receives the fifth data bit (BIT5) of the set of data bits by way of the bit line 306. The twenty-seventh memory cell 322a is connected to the seventh word line 312 and the bit line 306 and receives the fifth data bit (BIT5) of the set of data bits by way of the bit line 306. The twenty-eighth memory cell 324a is connected to the eighth word line 314 and the bit line 306 and receives the fifth data bit (BIT5) of the set of data bits by way of the bit line 306. At least one of the twenty-fifth through twenty-eighth memory cells 318a-324a store the fifth data bit (BIT5) when at least one of the corresponding fifth through eighth word lines 308-314 are active. The twenty-fifth through twenty-eighth memory cells 318a-324a do not store the fifth data bit (BIT5) when the corresponding fifth through eighth word lines 308-314 are inactive.

The twenty-fifth through twenty-eighth memory cells 318a-324a of the seventh memory block 302 form a matrix of memory cells. The twenty-fifth memory cell 318a is adjacent to the twenty-sixth and twenty-eighth memory cells 320a and 324a. The twenty-sixth memory cell 320a is adjacent to the twenty-fifth and twenty-seventh memory cells 318a and 322a. The twenty-seventh memory cell 322a is adjacent to the twenty-sixth and twenty-eighth memory cells 320a and 324a. The twenty-eighth memory cell 324a is adjacent to the twenty-fifth and twenty-seventh memory cells 318a and 322a. This arrangement is different from that in a conventional memory device in which the twenty-fifth through twenty-eighth memory cells 318a-324a are linearly arranged in a column. Thus, the column (i.e., all the memory cells of the column including the twenty-fifth through twenty-eighth memory cells 318a-324a) of the conventional error-resilient memory device is folded to form the matrix in the error-resilient memory device 300 of the present invention. This matrix is referred to as the seventh memory block 302. Hence, this implementation of the error-resilient memory device 300 is referred to as 'column-folding implementation'. Further, the bit line 306 that was connected to each memory cell placed in a linear arrangement in the conventional memory device now appears to have been folded to connect to each memory cell in the seventh memory block 302. Thus, the 'column-folding implementation' is also referred to as 'bit line folding implementation'. In one embodiment, the twenty-fifth through twenty-eighth memory cells 318a-324a form a square matrix. In another embodiment, the twenty-fifth through twenty-eighth memory cells 318a-324a form a rectangular matrix (not shown).

Figure 4A:
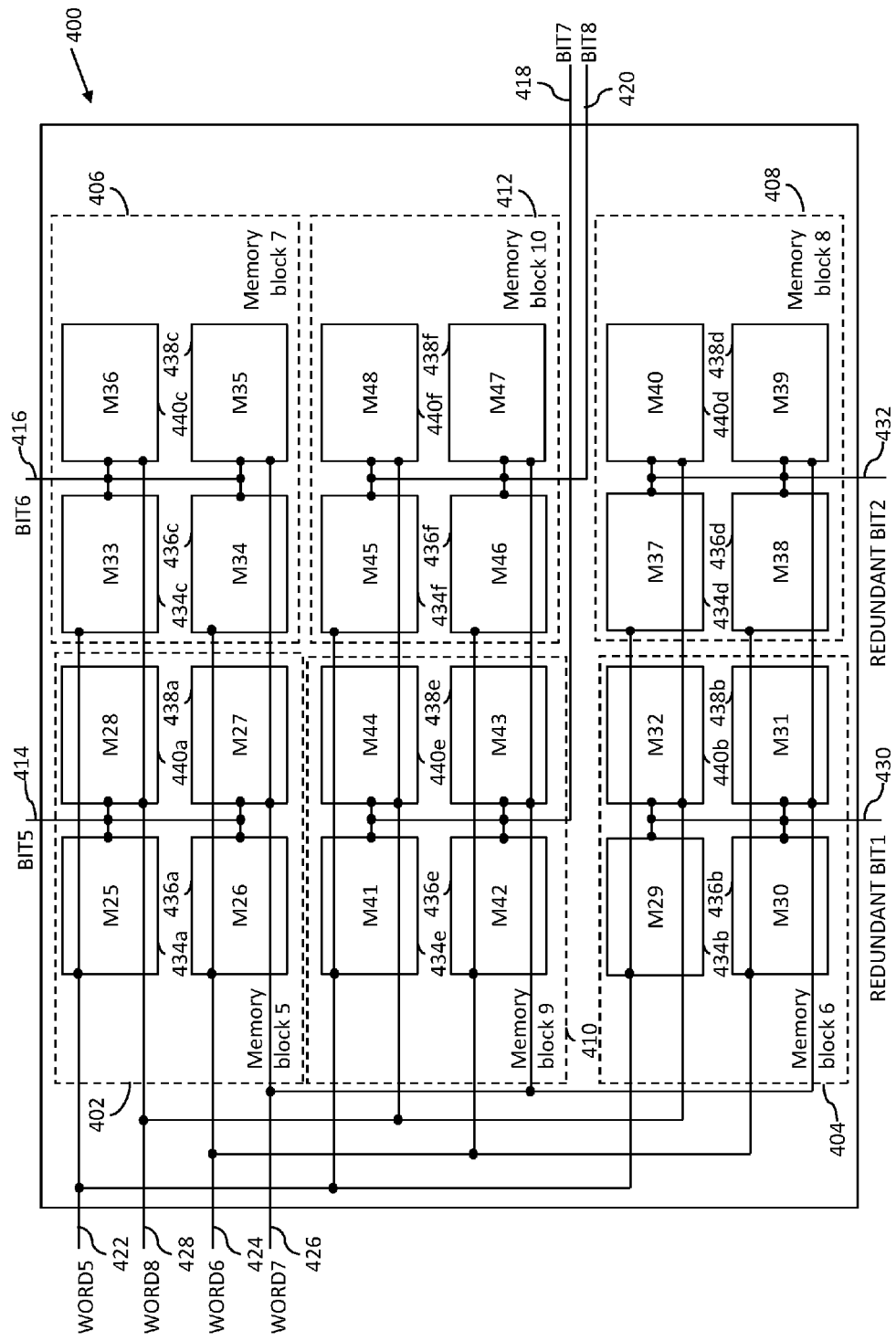
FIG. 4A is a schematic block diagram of an error-resilient memory device including seventh through twelfth memory blocks in accordance with another embodiment of the present invention.

Referring now to FIG. 4A, a schematic block diagram of an error-resilient memory device 400 including seventh through twelfth memory blocks 402-412 in accordance with an embodiment of the present invention is shown. Each of the seventh, ninth, eleventh, and twelfth memory blocks 402, 406, 410, and 412 are accessed using fifth through eighth memory addresses, respectively. Further, the error-resilient memory device 400 includes fifth through eighth bit lines 414-420, fifth through eighth word lines 422-428, and first and second redundant bit lines 430 and 432. In the presently preferred embodiment, the fifth through eighth word lines 422-428, the fifth through eighth bit lines 414-420, and the first and second redundant bit lines 430 and 432 are metallic inter-connections. The error-resilient memory device 400 further includes a control logic (not shown). In one embodiment, the error-resilient memory device 400 includes a clock source (not shown) that provides a clock signal (not shown). In another embodiment, the error-resilient memory device 400 is connected to an external clock source that provides the clock signal.

The seventh memory block 402 includes twenty-fifth through twenty-eighth memory cells 434a-440a, which are shown as M25-M28 in FIG. 4A, respectively. The eighth memory block 404 includes twenty-ninth through thirty-second memory cells 434b-440b, which are shown as M29-M32 in FIG. 4A, respectively. The ninth memory block 406 includes thirty-third through thirty-sixth memory cells 434c-440c, which are shown as M33-M36 in FIG. 4A, respectively. The tenth memory block 408 includes thirty-seventh through fortieth memory cells 434d-440d, which are shown as M37-M40 in FIG. 4A, respectively. The eleventh memory block 410 includes forty-first through forty-fourth memory cells 434e-440e, which are shown as M41-M44 in FIG. 4A, respectively. The twelfth memory block 412 includes forty-fifth through forty-eighth memory cells 434f-440f, which are shown as M45-M48 in FIG. 4A, respectively.

In the presently preferred embodiment, each of the seventh, ninth, eleventh, and twelfth memory blocks 402, 406, 410, and 412 is 'a functional memory block'. Each of the seventh, ninth, eleventh, and twelfth memory blocks 402, 406, 410, and 412 is structurally and functionally similar to the seventh memory block 302 of the error-resilient memory device 300. Each of the twenty-fifth through twenty-eighth memory cells 434a-440a, thirty-third through thirty-sixth memory cells 434c-440c, and forty-first through forty-eighth memory cells 434e-440e and 434f-440f is 'a functional memory cell'. Further, each of the eighth and tenth memory blocks 404 and 408 is referred to as 'a redundant memory block' and is used for storing at least one data bit of the set of data bits when at least one of the seventh, ninth, eleventh, and twelfth memory blocks 402, 406, 410, and 412 includes a fault. Each of the twenty-ninth through thirty-first and thirty-seventh through fortieth memory cells 434b-440b and 434d-440d is 'a redundant memory cell'. Each of the eighth and tenth memory blocks 404 and 408 is structurally and functionally similar to the eighth memory block 304 of the error-resilient memory device 300. Further, a set of strap cells (not shown) and a set of isolation cells (not shown) are used in the error-resilient memory device 400 for providing power to the seventh through twelfth memory blocks 402-412 and also for providing isolation among the seventh through twelfth memory blocks 402-412.

The control logic of the error-resilient memory device 400 is structurally and functionally similar to the control logic of the error-resilient memory device 300. In one embodiment, the control logic of the error-resilient memory device 400 is implemented using a control circuit. The control circuit activates a corresponding word line of the fifth through eighth word lines 422-428. Further, the control circuit provides a value of the at least one of fifth through eighth data bits (BIT5-BIT8) to at least one of the first and second redundant bit lines 430 and 432 based on the faults detected in the seventh, ninth, eleventh, and twelfth memory blocks 402, 406, 410, and 412 and a state of at least one of the fifth through eighth word lines 422-428.

Each of the seventh through twelfth memory blocks 402-412 is connected to the fifth through eighth word lines 422-428. The seventh, ninth, eleventh, and twelfth memory blocks 402, 406, 410, and 412 are connected to the fifth through eighth bit lines 414-420, for receiving the fifth through eighth data bits (BIT5-BIT8) of the set of data bits, respectively. Thus, the seventh, ninth, eleventh, and twelfth memory blocks 402, 406, 410, and 412 store the fifth through eighth data bits (BIT5-BIT8), respectively, based on the state of the fifth through eighth word lines 422-428. The eighth and tenth memory blocks 404 and 408 are connected to the first and second redundant bit lines 430 and 432, respectively. The seventh memory block 402 is adjacent to the ninth and eleventh memory blocks 406 and 410. The ninth memory block 406 is adjacent to the seventh and twelfth memory blocks 402 and 412. The eleventh memory block 410 is adjacent to the seventh and twelfth blocks 402 and 412. The twelfth memory block 412 is adjacent to the ninth and eleventh blocks 406 and 410. The eighth and tenth memory blocks 404 and 408 are adjacent with each other.

In operation, the seventh memory block 402 receives the fifth data bit (BIT5), the fifth word line 422 is active, and the twenty-fifth memory cell 434a does not include a fault. Hence, the twenty-fifth memory cell 434a stores the fifth data bit BIT5.

Figure 4B:
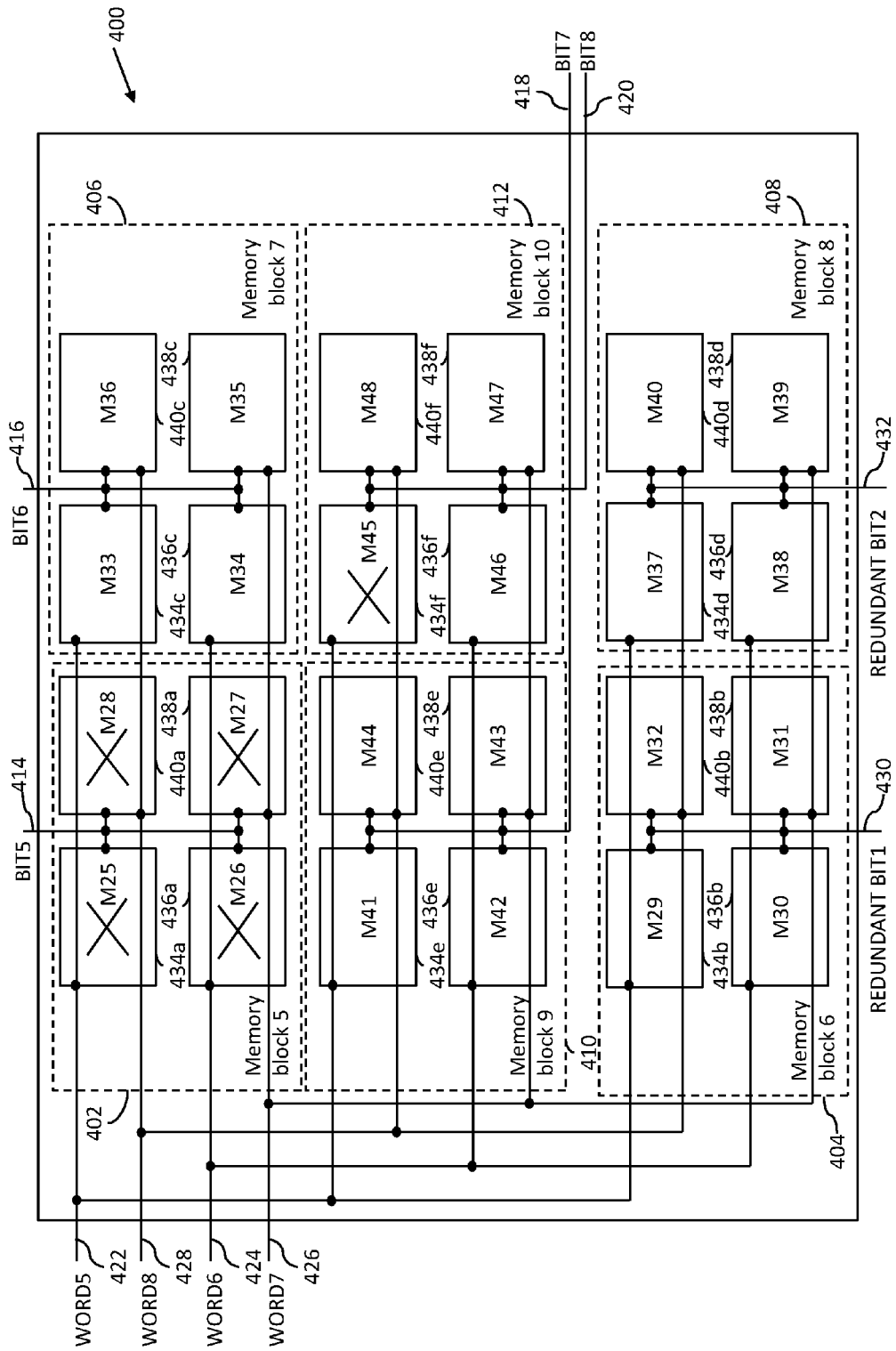
FIG. 4B is a schematic block diagram of the error-resilient memory device of FIG. 4B that illustrates a set of faults.

Referring now to FIG. 4B, a schematic block diagram of the error-resilient memory device 400 that has a set of faults in accordance with an embodiment of the present invention is shown. The set of faults includes a set of concentrated faults and a random fault. During the testing process of the error-resilient memory device 400, the set of concentrated faults is detected in the twenty-fifth through twenty-eighth memory cells 434a-440a, and a random fault is detected in the forty-fifth memory cell 434f.

In operation, the seventh memory block 402 receives the fifth data bit (BIT5) and the twelfth memory block 412 receives the eighth data bit (BIT8), and the fifth, seventh, and eighth word lines 422, 426, and 428 are active in first through third clock cycles, respectively. Due to the detection of the set of concentrated faults in the seventh memory block 402, the control circuit provides the value of the fifth data bit (BIT5) as a first redundant bit (REDUNDANT_BIT1) to the first redundant bit line 430. Further, since the fifth, seventh, and eighth word lines 422, 426, and 428 are active, the first redundant bit (REDUNDANT_BIT1) is stored in the twenty-ninth, thirtieth, and thirty-first memory cells 434b, 438b, and 440b in the first through third clock cycles, respectively, to overcome the inaccuracy in storage of the fifth data bit (BIT5). Due to the detection of a random fault in the twelfth memory block 412, the control circuit provides the value of the eighth data bit (BIT8) as a second redundant bit (REDUNDANT_BIT2) to the second redundant bit line 432. Further, since the fifth word line 422 is active, the second redundant bit (REDUNDANT_BIT2) is stored in the thirty-seventh memory cell 434d to overcome the inaccuracy in storage of the eighth data bit (BIT8).

For the aforementioned embodiment with the set of concentrated faults and a random fault, it is known to a person skilled in the art that a conventional error-resilient memory device requires at least three redundant columns for storage of data bits of the damaged memory cells. Further, the conventional error-resilient memory device stores data bits corresponding to the twenty-fifth through twenty-eighth, forty-first through forty-sixth, thirty-third and thirty-fourth memory cells 434a-440a, 434e-440e, 434f, 436f, 434c, and 436c in three redundant columns. Thus, the undamaged cells are not utilized in the conventional error-resilient memory device, decreasing the efficiency. However, the error-resilient memory device 400 is efficient and requires only two redundant memory blocks for accurately storing the fifth and eighth data bits (BIT5 and BIT8) despite damage to the twenty-fifth through twenty-eighth, and the forty-fifth memory cells 434a-440a and 434f instead of the at least three redundant columns of the conventional error-resilient memory device.

Thus, each of the error-resilient memory device 100-400 stores the set of data bits in at least one redundant memory block when a functional memory block includes a fault without the determination of redundant rows and redundant columns that is required in the conventional error-resilient memory device. The determination of the at least one redundant memory block is a 'linear problem'. It is well-known to a person skilled in the art that the determination of redundant rows and redundant columns is 'a non-deterministic polynomial time (NP) complete' problem and that solving a linear problem is less complex than solving an NP complete problem. Hence, the complexity and power consumption of the control circuit along with the processing-time required by the control circuit is reduced. Thus, the time required in the testing process of the error-resilient memory devices 100-400 of the present invention is reduced. Further, when the set of concentrated faults occur in adjacent memory cells within the functional memory block, a reduced number of redundant memory cells are utilized for accurately storing the set of data bits. Thus, less number of undamaged memory cells are unused, thereby increasing the memory repair efficiency of the error-resilient memory devices 100-400. Further, the threshold number of faults for which each of the error-resilient memory device 100-400 is usable increases due to the increased memory repair efficiency. Moreover, when the number of memory cells in each memory block is large, the memory repair efficiency increases further.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:
1. An error-resilient memory device, comprising:
 a first memory block that includes a first set of memory cells, wherein the first memory block is connected to a first word line and a set of bit lines, receives a set of data bits by way of the set of bit lines, and stores the set of data bits in the first set of memory cells when the first word line is active, wherein each memory cell of the first set of memory cells is adjacent to at least two other memory cells of the first set of memory cells such that a row of the first set of memory cells is folded, wherein the first word line is connected to each memory cell of the first set of memory cells, and wherein each memory cell of the first set of memory cells is connected to a separate one of the bit lines of the set of bit lines; and a second memory block that includes a second set of memory cells, wherein the second memory block is connected to a redundant word line and the set of bit lines, receives the set of data bits by way of the corresponding set of bit lines, and stores the set of data bits when the redundant word line is active, wherein each memory cell of the second set of memory cells is adjacent to at least two other memory cells of the second set of memory cells, such that a row of the second set of memory cells is folded, wherein the redundant word line is connected to each memory cell of the second set of memory cells, wherein the set of bit lines is connected to the corresponding second set of memory cells, and wherein when the first memory block includes a fault, the redundant word line is active and the first word line is inactive.

2. The error-resilient memory device of claim 1, wherein the first set of memory cells comprises:

a first memory cell, connected to the first word line and a first bit line of the set of bit lines, that receives a first data bit of the set of data bits by way of the first bit line and stores the first data bit when the first word line is active;

a second memory cell, connected to the first word line and a second bit line of the set of bit lines, that receives a second data bit of the set of data bits by way of the second bit line and stores the second data bit when the first word line is active;

a third memory cell, connected to the first word line and a third bit line of the set of bit lines, that receives a third data bit of the set of data bits by way of the third bit line and stores the third data bit when the first word line is active; and a fourth memory cell, connected to the first word line and a fourth bit line of the set of bit lines, that receives a fourth data bit of the set of data bits by way of the fourth bit line and stores the fourth data bit when the first word line is active.

3. The error-resilient memory device of claim 2, wherein:
the first memory cell is adjacent to the second and fourth memory cells,
the second memory cell is adjacent to the first and third memory cells,
the third memory cell is adjacent to the second and fourth memory cells, and
the fourth memory cell is adjacent to the first and third memory cells, such that the row of the first through fourth memory cells is folded such that a matrix of the memory cells is formed.

4. The error-resilient memory device of claim 2, wherein the second set of memory cells comprises:
a fifth memory cell, connected to the redundant word line and the first bit line, that receives the first data bit by way of the first bit line and stores the first data bit when the redundant word line is active;

a sixth memory cell, connected to the redundant word line and the second bit line, that receives the second data bit by way of the second bit line and stores the second data bit when the redundant word line is active;

a seventh memory cell, connected to the redundant word line and the third bit line, that receives the third data bit by way of the third bit line and stores the third data bit when the redundant word line is active; and an eighth memory cell, connected to the redundant word line and the fourth bit line, that receives the fourth data bit and by way of the fourth bit line stores the fourth data bit when the redundant word line is active.

5. The error-resilient memory device of claim 4, wherein:
the fifth memory cell is adjacent to the sixth and eighth memory cells,
the sixth memory cell is adjacent to the fifth and seventh memory cells,
the seventh memory cell is adjacent to the sixth and eighth memory cells, and
the eighth memory cell is adjacent to the fifth and seventh memory cells, such that the row of the fifth through eighth memory cells is folded and a matrix of the memory cells is formed.

6. An error-resilient memory device, comprising:
a first memory block that includes a first set of memory cells, wherein the first memory block is connected to a first bit line and a set of word lines, receives a first data bit by way of the first bit line, and stores the first data bit when at least one word line of the set of word lines is active, wherein each memory cell of the first set of memory cells is adjacent to at least two other memory cells of the first set of memory cells, such that a column of the first set of memory cells is folded; and a second memory block that includes a second set of memory cells, wherein the second memory block is connected to a redundant bit line and the set of word lines, and receives a redundant data bit by way of the redundant bit line and stores the redundant data bit when at least one word line of the set of word lines is active, wherein each memory cell of the second set of memory cells is adjacent to at least two other memory cells of the second set of memory cells, such that a column of the second set of memory cells is folded, wherein the first bit line is connected to each memory cell of the first set of memory cells, and the redundant bit line is connected to each memory cell of the second set of memory cells, wherein each memory cell of the first set of memory cells is connected to a separate one of the word lines of the set of word lines, and each memory cell of the second set of memory cells is connected to a respective one of the word lines of the set or word lines, and wherein when the first memory block includes a fault, the redundant data bit is equal to the first data bit.

7. The error-resilient memory device of claim 6, wherein the first set of memory cells comprises:
a first memory cell, connected to the first bit line and a first word line of the set of word lines, that receives a first data bit and stores the first data bit when the first word line is active;
a second memory cell, connected to the first bit line and a second word line of the set of word lines, that receives the first data bit and stores the first data bit when the second word line is active;

a third memory cell, connected to the first bit line and a third word line of the set of word lines, that receives the first data bit and stores the first data bit when the third word line is active; and a fourth memory cell, connected to the first bit line and a fourth word line of the set of word lines, that receives the first data bit and stores the first data bit when the fourth word line is active, and wherein the first memory cell is adjacent to the second and fourth memory cells, the second memory cell is adjacent to the first and third memory cells, the third memory cell is adjacent to the second and fourth memory cells, and the fourth memory cell is adjacent to the first and third memory cells, such that the column of the first through fourth memory cells is folded to form a matrix thereof.

8. The error-resilient memory device of claim 7, wherein the second set of memory cells comprises:

a fifth memory cell, connected to the first word line and the redundant bit line, that receives the redundant data bit and stores the redundant data bit when the first word line is active;

a sixth memory cell, connected to the second word line and the redundant bit line, that receives the redundant data bit, and stores the redundant data bit when the second word line is active;

a seventh memory cell, connected to the third word line and the redundant bit line, that receives the redundant data bit and stores the redundant data bit when the third word line is active; and an eighth memory cell, connected to the fourth word line and the redundant bit line, that receives the redundant data bit and stores the redundant data bit when the fourth word line is active, and wherein the fifth memory cell is adjacent to the sixth and eighth memory cells, the sixth memory cell is adjacent to the fifth and seventh memory cells, the seventh memory cell is adjacent to the sixth and eighth memory cells, and the eighth memory cell is adjacent to the fifth and seventh memory cells, such that the column of the fifth through eighth memory cells is folded to form a matrix thereof.

9. An error-resilient memory device, comprising:

a first memory block that includes a first set of memory cells, wherein the first memory block is connected to a first bit line and a set of word lines, receives a first data bit by way of the first bit line, and stores the first data bit when at least one word line of the set of word lines is active, wherein each memory cell of the first set of memory cells is adjacent to at least two other memory cells of the first set of memory cells, such that a column of the first set of memory cells is folded, wherein the first bit line is connected to each memory cell of the first set of memory cells, and wherein each memory cell of the first set of memory cells is connected to a separate one of the word lines of the set of word lines; and a second memory block that includes a second set of memory cells, wherein the second memory block is connected to a redundant bit line and the set of word lines, receives a redundant data bit by way of the redundant bit line, and stores the redundant data bit when at least one word line of the set of word lines is active, wherein each memory cell of the second set of memory cells is adjacent to at least two other memory cells of the second set of memory cells, such that a column of the second set of memory cells is folded, wherein the redundant bit line is connected to each memory cell of the second set of memory cells, and wherein each memory cell of the second set of memory cells is connected to a separate one of the word lines of the set of word lines, and wherein when the first memory block includes a fault, the redundant data bit is equal to the first data bit.

10. The error-resilient memory device of claim 9, wherein the first set of memory cells comprises:

a first memory cell, connected to the first bit line and a first word line of the set of word lines, that receives a first data bit and stores the first data bit when the first word line is active;

a second memory cell, connected to the first bit line and a second word line of the set of word lines, that receives the first data bit and stores the first data bit when the second word line is active;

a third memory cell, connected to the first bit line and a third word line of the set of word lines, that receives the first data bit and stores the first data bit when the third word line is active; and a fourth memory cell, connected to the first bit line and a fourth word line of the set of word lines, that receives the first data bit and stores the first data bit when the fourth word line is active, wherein the first memory cell is adjacent to the second and fourth memory cells, the second memory cell is adjacent to the first and third memory cells, the third memory cell is adjacent to the second and fourth memory cells, and the fourth memory cell is adjacent to the first and third memory cells, such that the column of the first through fourth memory cells is folded to form a matrix thereof.

11. The error-resilient memory device of claim 10, wherein the second set of memory cells comprises:

a fifth memory cell, connected to the first word line and the redundant bit line, that receives the redundant data bit and stores the redundant data bit when the first word line is active;

a sixth memory cell, connected to the second word line and the redundant bit line, that receives the redundant data bit and stores the redundant data bit when the second word line is active;

a seventh memory cell, connected to the third word line and the redundant bit line, that receives the redundant data bit and stores the redundant data bit when the third word line is active; and an eighth memory cell, connected to the fourth word line and the redundant bit line, that receives the redundant data bit and stores the redundant data bit when the fourth word line is active, wherein the fifth memory cell is adjacent to the sixth and eighth memory cells, the sixth memory cell is adjacent to the fifth and seventh memory cells, the seventh memory cell is adjacent to the sixth and eighth memory cells, and the eighth memory cell is adjacent to the fifth and seventh memory cells, such that the column of the fifth through eighth memory cells is folded to form a matrix thereof.

* * * * *